(12) United States Patent
Hawkins et al.

(10) Patent No.: US 7,241,630 B2
(45) Date of Patent: Jul. 10, 2007

(54) PARAMAGNETIC PARTICLE DETECTION

(75) Inventors: Peter Hawkins, Bristol (GB); Richard William Luxton, Bristol (GB)

(73) Assignee: Randox Laboratories, Ltd., Antrim (GB)

( * ) Notice: Subject to any disclaimer, the term of this patent is extended or adjusted under 35 U.S.C. 154(b) by 826 days.

(21) Appl. No.: 09/816,225

(22) Filed: Mar. 26, 2001

(65) Prior Publication Data
US 2001/0050555 A1   Dec. 13, 2001

(30) Foreign Application Priority Data
Apr. 10, 2000   (EP) ................................. 00302993

(51) Int. Cl.
| | |
|---|---|
| G01N 33/553 | (2006.01) |
| G01N 27/84 | (2006.01) |
| H03L 7/00 | (2006.01) |
| H03B 21/00 | (2006.01) |
| G01R 33/04 | (2006.01) |
| G01N 33/53 | (2006.01) |
| B01J 19/08 | (2006.01) |
| B01D 35/06 | (2006.01) |

(52) U.S. Cl. ...................... 436/526; 436/518; 436/523; 436/164; 436/804; 436/501; 435/7.1; 435/50; 435/4; 435/5; 422/68.1; 210/209; 210/222; 210/223; 209/214; 455/260; 455/76; 455/343; 331/17; 331/25; 331/42; 331/94.1; 324/214; 324/233; 324/236; 324/522

(58) Field of Classification Search ................ 436/526, 436/518, 523, 164, 886, 501; 422/186.01, 422/68.1, 186.05; 435/7.1, 50, 4, 5, 6; 210/209, 210/222, 223; 209/214; 455/260, 76, 343; 331/17, 25, 42, 94.1; 324/214, 223, 236, 324/522
See application file for complete search history.

(56) References Cited

U.S. PATENT DOCUMENTS 3,719,882 A * 3/1973 Pincus .......................... 324/330

(Continued)

OTHER PUBLICATIONS

Hawkins et al. "Measuring system for the rapid determination of the concentration of coated micrometer-sized paramagnetic particles suspended in aqueous buffer solutions", Review of Scientific Instruments, Jan. 2001, vol. 72, No. 1, pp. 237-242.

(Continued)

*Primary Examiner*—Long V. Le
*Assistant Examiner*—Pensee T. Do
(74) *Attorney, Agent, or Firm*—Oliff & Berridge, PLC

(57) ABSTRACT

A method of determining the number of magnetic particles within a sample using a tuned circuit having a capacitor and a coil. The method comprises:
 a. determining the difference in the resonant frequency of the tuned circuit when the sample is exposed to a magnetic field generated by the coil and when the sample is not exposed to the magnetic field generated by the coil; and
 b. using the difference in the resonant frequency to determine the number of magnetic particles within the sample.

5 Claims, 9 Drawing Sheets

U.S. PATENT DOCUMENTS

| | | | | |
|---|---|---|---|---|
| 3,858,111 | A | * | 12/1974 | Simpson, Jr. ............... 324/310 |
| 4,314,821 | A | * | 2/1982 | Rice ........................... 436/540 |
| 4,912,976 | A | * | 4/1990 | Labriola, II ............... 73/290 R |
| 4,940,939 | A | | 7/1990 | Khait et al. |
| 5,493,922 | A | * | 2/1996 | Ramey et al. ........... 73/863.02 |
| 5,528,142 | A | | 6/1996 | Feickert |
| 5,608,318 | A | | 3/1997 | Yasui |
| 5,679,342 | A | * | 10/1997 | Houghton et al. |
| 5,922,537 | A | | 7/1999 | Ewart et al. |
| 5,978,694 | A | | 11/1999 | Rapoport |
| 5,981,297 | A | * | 11/1999 | Baselt |
| 6,046,585 | A | * | 4/2000 | Simmonds ................. 324/239 |
| 6,100,660 | A | * | 8/2000 | Kritz et al. |
| 6,636,727 | B2 | * | 10/2003 | Muschallik et al. ........ 455/260 |

OTHER PUBLICATIONS

Kriz et al., "Advancements toward magneto immunoassays", Biosensors and Bioelectrics, 13 (1998) pp. 817-823.

Kriz et al., "Magnetic Permeability Measurements in Bioanalysis and Biosensors", Analytical Chemistry, 68 (1996) pp. 1996-1970.

* cited by examiner

L = 75μH
C1=1n5, c2=4n7 for f = 400kHz
C1=470p, C2=1n5 for f = 870kHz

PARAMAGNETIC PARTICLE DETECTION

FIELD OF THE INVENTION

The present invention relates to a method and apparatus for determining the number of magnetic particles within a sample, for example a method of determining the number of magnetic particles when performing an immunoassay.

The technique allows coated paramagnetic particles (PMP's) to be used as labels and to detect them using a novel electronic circuitry design.

DESCRIPTION OF THE PRIOR ART

The PMP's are typically 2.8 µm in diameter and consist of a core of a paramagnetic material coated with a suitable polymer layer to which are attached antibody/antigen layers depending on the particular application of the PMP. Currently, the main application of these particles is in sample separation, purification and as a solid phase for immunoassays.

In a typical immunoassay, the PMP's are coated with proteins allowing them to be used as the solid phase material on which an immune reaction takes place. The immune reaction is detected and quantified using a label such as an enzyme, fluorescent or chemiluminescent molecule. The PMP's are not permanently magnetised but are attracted to permanent magnets allowing simple washing procedures, therefore washing the coated PMP's does not require filtration or centrifugation. Following the washing steps, the immobilized label on the surface of the coated PMP's is detected using a suitable technique.

The use of ferromagnetic particles as labels in an immunoassay has been described in two papers by Kriz et al. These are "Advancements Toward Magneto Immunoassays" from Biosensors and Bioelectronics 13 (1998) pages 817 to 823 and "Magnetic Permeability Measurements In Bioanalysis and Biosensors" from Analytical Chemistry 1996, 68, 1966 to 1970. However, in these techniques the ferromagnetic particles are detected by a simple measuring coil which is placed in a Maxwell bridge to allow measurement of the magnetic permeability of a sample to be made. The magnetic permeability is then used as an indication to determine the number of particles within the substance.

SUMMARY OF THE INVENTION

In accordance with the first aspect of the present invention, we provide a method of determining the number of magnetic particles within a sample using a tuned circuit having a capacitor and a coil, the method comprising:
 a. determining the difference in the resonant frequency of the tuned circuit when the sample is, and when the sample is not, contained within the coil;
 b. using the difference in the resonant frequency to determine the concentration of the magnetic particles.

In accordance with a second aspect of the present invention we provide apparatus for determining the concentration of magnetic particles within a sample, the apparatus comprising:
 a. a tuned circuit having a capacitor and a coil;
 b. a driver which generates a driving signal for driving the tuned circuit;
 c. a detector for detecting the resonant frequency of the tuned circuit, the difference in the resonant frequency of the tuned circuit when the sample is, and when the sample is not, contained within the coil representing the concentration of the PMPs.

Accordingly, the present invention provides a method and apparatus for determining the number of magnetic particles within a sample. The present invention utilizes the fact that the presence of magnetic particles, such as paramagnetic, ferromagnetic particles, or the like will lead to an inherent change in the permeability of the sample. Because the self-inductance of a coil depends on the permeability of the material within the coil, placing a sample containing magnetic particles in a coil will result in a change in the inductance of the coil. The present invention utilizes this effect by obtaining an indication of the inductance of the coil by measuring the resonant frequency of an LC circuit including the coil. The resonant frequency of the circuit will be different when the sample is placed within the coil compared to when the sample is removed from the coil. Accordingly, by measuring the change in the resonant frequency of the LC circuit, it is possible to determine the number of magnetic particles within the sample. Furthermore, by selecting the coil to be one of a solenoid, a ring coil and a flat coil, this helps minimize the dead space between the coil and the sample, thereby ensuring that an optimum signal is obtained.

Typically, the step of determining the difference in the resonant frequency of the tuned circuit comprises placing the sample within the coil; determining the resonant frequency of the tuned circuit; removing the sample from the coil; and, determining the resonant frequency of the tuned circuit. It is preferred to determine the resonant frequency of the tuned circuit with the sample present and then with the sample removed to account for long term variation in the resonant frequency of the coil. These long term variations are typically caused by variations in temperature within the surrounding environment, and other such factors. However, as these variations are typically long term occurring over several hours, then by making subsequent measurements with the sample present and then shortly afterwards with the sample removed, this ensures that any variation in the measured resonant frequency is solely due to the presence and/or absence of the sample. Accordingly, this helps prevent the variations in the inherent resonant frequency of the coil affecting the measurements. However, it will be realised that if a sufficiently stable tuned circuit could be provided then the resonant frequency of the tuned circuit without the sample would only need to be measured once and then used for all subsequent measurements.

Typically the step of determining the resonant frequency comprises applying the driver signal to the tuned circuit; measuring the phase difference between the driver signal and the output signal taken from the tuned circuit; and adjusting the frequency of the applied signal until there is no phase difference between the applied signal and the output signal. Other suitable methods may be used but this advantageously allows the circuit to be adjusted using a feedback mechanism so that the circuit automatically locates the resonant frequency.

The driver signal usually has a frequency of above 200 kHz and more particularly preferably has a frequency above 500 kHz. This is because at higher frequencies a given change in the inductance of a coil will result in a larger change in the resonant frequency of the tuned circuit. Accordingly, operating the circuit at a higher frequency increases the sensitivity of the system.

Typically the magnetic particles used are paramagnetic particles although ferromagnetic or any other magnetic particles may also be used.

The detector for detecting the resonant frequency of the tuned circuit may comprise a phase comparator, for determining the phase difference between the driver signal and an output signal obtained from the tuned circuit, whilst the driver for applying the driver signal to the circuit comprises a voltage controlled oscillator (VCO). This apparatus configuration advantageously allows the phase comparative to be coupled directly to the voltage controlled oscillator such that the VCO is responsive to the phase comparator to alter the frequency of the driver signal until there is no phase difference.

Preferably the apparatus comprises a phase locked loop oscillator circuit. This is particularly advantageous because as mentioned above, this allows the resonant frequency of the tuned circuit to be accurately determined without human intervention. This is an automatic procedure resulting in highly accurate results.

The invention is particularly suited for use during an immunoassay. However, it is also applicable for use with other types of samples such as bottles and other containers, labels etc.

In accordance with a third aspect of the present invention, we provide a method of performing a binding assay, the method comprising:
 a. immobilising a layer of molecules to a substrate;
 b. providing a number of magnetic particles as labels;
 c. performing a reaction using the molecular layer so as to bind at least some of the magnetic particles to the substrate; and,
 d. determining the number of magnetic particles bound to the substrate by determining the difference in the resonant frequency of a tuned circuit when the substrate is exposed to a magnetic field generated by a coil, and when the substrate is not exposed to the magnetic field generated by the coil.

Accordingly, the present invention also provides a method of performing an assay using magnetic particles as labels. This is achieved using a substrate to which has been immobilized a layer of molecules appropriate to the assay. The reaction is designed in such a way that bonds form between the coating on the magnetic particle and the immobilized layer on the substrate. The number of particles bonding to the substrate depends on the concentration of species being measured. Accordingly, by measuring the change in the resonant frequency of the tuned circuit when the substrate is contained within, and when the substrate is not contained within the coil, allows the number of magnetic particles bound to the substrate to be determined.

Typically the magnetic particles are bound to a respective number of second molecules and wherein the reaction binds the second molecules with the layer of molecules so as to bind the magnetic particles to the substrate. Alternatively however the magnetic particles may be designed to react directly with the molecules bound to the substrate.

The reaction may be any form of reaction, such as a DNA hybridization reaction. In this case, the first and second molecules would comprise portions of DNA. However, preferably the binding assay is an immunoassay in which case the molecule layer is an antibody/antigen layer and the second molecules are antigens or antibodies. Accordingly, the magnetic particles can be coupled to the antigens or antibodies which then bind to the antibody/antigen layer formed on the substrate.

As mentioned above, when samples are provided on a substrate, it is preferable to minimize the dead space between the coil and the sample. Preferably, therefore, the tuned circuit is one of a solenoid, a ring coil and a flat coil.

In this case, if the coil is a solenoidal coil, the method typically involves exposing the sample to the magnetic field by placing it in the coil. Furthermore, the coil preferably has an oval cross-section, although a rectangular cross-section can be used. Alternatively however, flat coils may be used with the sample being exposed to the magnetic field by placing the sample adjacent the coil.

It will be realised that the third aspect of the present invention can advantageously be implemented using the first and second aspects of the present invention. Accordingly, the above described electronic circuitry can be used to generate an output directly related to the number of immobilized PMP's on the strip. In this approach, the PMP particles are now being used as markers and separate fluorescent, radioactive, chemiluminescent or other markers are not required. This considerably reduces the number of analytical steps and speeds up the time required for an assay. Furthermore, the electronic circuitry is physically small enough to allow the development of a hand-held instrument.

Current analytical immunoassay systems using fluorescent or similar markers require expensive specialized equipment and it is not practical to make them into hand-held systems. The only hand-held systems available at present use dipstick technology with colour labels. They are mainly used for near patient testing such as pregancy testing where the outcome of the test can only be either positive or negative. They are generally not suitable for use in tests where the actual concentration of a species is being determined.

BRIEF DESCRIPTION OF THE DRAWINGS

Examples of the present invention will now be described with reference to the accompanying drawings, in which.

DETAILED DESCRIPTION OF THE EMBODIMENTS

In one example of the present invention, the number of coated paramagnetic particles on a plastic strip is determined by placing the strip in a coil of insulated wire and observing the effect their presence has on the self-inductance, L, of the coil. The assumption is that the only significant contribution to changes in the inductance of the coil comes from the high magnetic permeability of the particles.

The self-inductance of a uniform helical coil with a large number of turns is given by:

$$L \approx \mu\mu_0 m^2 lA \quad (1)$$

where:
$\mu_0$=permeability of a vacuum ($4\pi \times 10^{-7}$ H m$^{-1}$);
$\mu$=relative permeability of the core;
m=number of turns per unit length;
l=length; and,
A=cross-sectional area of the coil.

When a plastic strip, with n paramagnetic particles attached to it, is placed in the coil, the effective value of $\mu$ for the coil is some value related to the individual permeabilities of the plastic in the strip $\mu_v$, any residual buffer solution on the plastic strip $\mu_s$, the particles $\mu_p$, and the air space in the coil $\mu_A$. The inductance now becomes:

$$L = \{c_v\mu_v + c_A\mu_A + c_s\mu_s + nc\mu_p\}\mu_0 m^2 lA \quad (2)$$
$$= \{c_v\mu_v + c_A\mu_A + c_s\mu_s\}\mu_0 m^2 lA + nc\mu_p m^2 lA$$

where:
$c_v$=effective quantity of plastic in the strip;
$c_s$=effective quantity of buffer in the strip;
$C_A$=effective quantity of air in the coil; and,
c=a constant relating the permeability of individual particles to the contribution they make to the total permeability.

As the particles are very much smaller than the internal volume of the coil, the magnetic field surrounding each particle is non-uniform, but since the particles are all the same shape and size (2.8 µm diameter) they contribute equally to the total effective permeability. For all samples in these investigations, the plastic strips were of identical construction and the volume of the buffer solution residue may be assumed to be constant. So all the values in the first term are constant, or negligibly small, and equation (1) may be rewritten:

$$L = L_0 + kn \quad (3)$$

where:
k=$c\mu_p\mu_0 m^2 lA$
a constant; and,
$L_0 = \{c_v\mu_v + c_A\mu_A + c_s\mu_s\}\mu_0 m^2 lA$
=another constant corresponding to the inductance of the coil containing a plastic strip with just the buffer solution residue and no particles on it.

The inductance of the coil therefore increases uniformly with the number of particles on the strip. To maximise the effect of n on L and so improve the sensitivity of the detecting system, $L_0$ should be as small as possible and k as large as possible. Keeping the dead space in the coil to a minimum by decreasing the internal dimensions of the coil so that they are just large enough to contain the sample strip will reduce $c_A$ and hence $L_0$. This will also ensure that more of the electromagnetic field in the coil passes through the particles so increasing c and hence k.

Figure 1A:
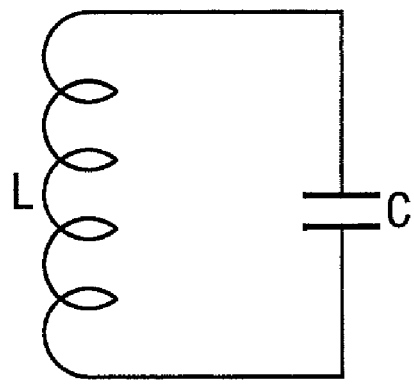
FIG. 1A is a schematic diagram of a first example of a tuned circuit.

The effect that the particles have on the inductance of the coil is determined by putting the strip in a coil L which forms a resonance circuit with a parallel capacitor C (FIG. 1A).

The resonant frequency of the circuit in FIG. 1A is given by:

$$f = \{2\pi(LC)^{1/2}\}^{-1} \quad (4)$$

From equations (3) and (4):

$$f = \{2\pi C^{1/2}(L_0+kn)^{1/2}\}^{-1} = \{2\pi(L_0C)^{1/2}\}^{-1}\{1+(k/L_0)n\}^{-1/2}$$

$$f = f_0\{1+(k/L_0)n\}^{-1/2} \quad (5)$$

where:
$f_0$=resonant frequency of the circuit containing a plastic strip with just the residue buffer solution and no particles.

Expanding equation (5) using the binomial theorem:

$$f = f_0\{1 - \tfrac{1}{2}(k/L_0)n + \ldots\}$$

$$f = f_0\{1 - \tfrac{1}{2}(k/L_0)n\} \text{ (ignoring higher terms)} \quad (6)$$

Equation (6) predicts that the frequency of oscillation of the LC-tuned circuit should decrease linearly with increasing numbers of paramagnetic particles present on the strip.

Figure 1B:
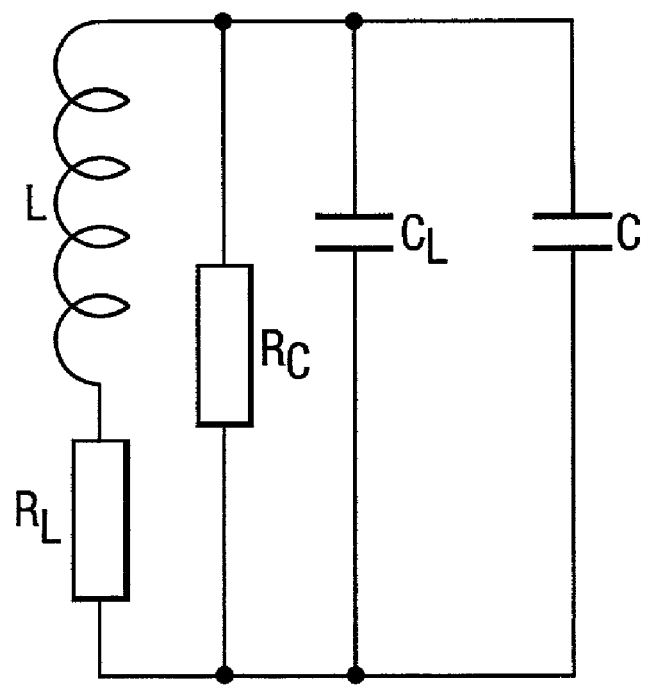
FIG. 1B is a schematic diagram of a second example of a tuned circuit.

In a practical LC circuit, as shown for example in FIG. 1B, the coil has an internal resistance $R_L$, the capacitor a leakage resistance $R_C$, and there is a stray capacitance $C_L$ mainly existing between individual windings in the coil. For a good quality capacitor, $R_C$ is very large and has a negligible effect on the performance of the circuit. The stray capacitance depends very much on the construction of the coil and reduces the resonant frequency of the circuit. If the coil has a rigid construction then $C_L$ should remain constant so its presence can be largely ignored. A slight decrease in the resonant frequency is usually observed when a blank plastic strip is inserted in the coil which can be attributed to an increase in $C_L$ as the plastic strip has a higher dielectric constant than the air it displaces. The internal resistance, $R_L$ probably has the greatest effect as it reduces the resonant frequency to:

$$f = \{1-(R_L^2 C/L)\}^{1/2}\{2\pi(LC)^{1/2}\}^{-1} \quad (7)$$

For a typical coil with L=130 µH, C=4.7 nF and $R_L$=17Ω, the effect of $R_L$ is to reduce the resonance frequency from f=203.61 kHz. (equation 4) to f=202.54 kHz (equation 7), i.e. the resonant frequency falls by 1.07 kHz.

The resonant frequency of a practical LC circuit is very temperature dependant. The values of all of the components shown in FIG. 1B vary with temperature to some extent and so contribute to the drift in the resonant frequency with temperature. The coil is made from thin copper wire which increases in resistance with temperature. Additionally, the dimensions of the coil and the capacitance of the capacitor C also change with temperature.

The frequency of oscillation of a LC circuit, and hence the number of particles on the plastic strip, is determined by using the LC circuit to control the frequency of oscillation of an oscillator circuit. Experimentation showed that typically the resonant frequency decreases by only a few Hz when a plastic strip with particles on it is placed in a coil oscillating at about 250 kHz. The oscillator circuit therefore has to be very stable.

Figure 2:
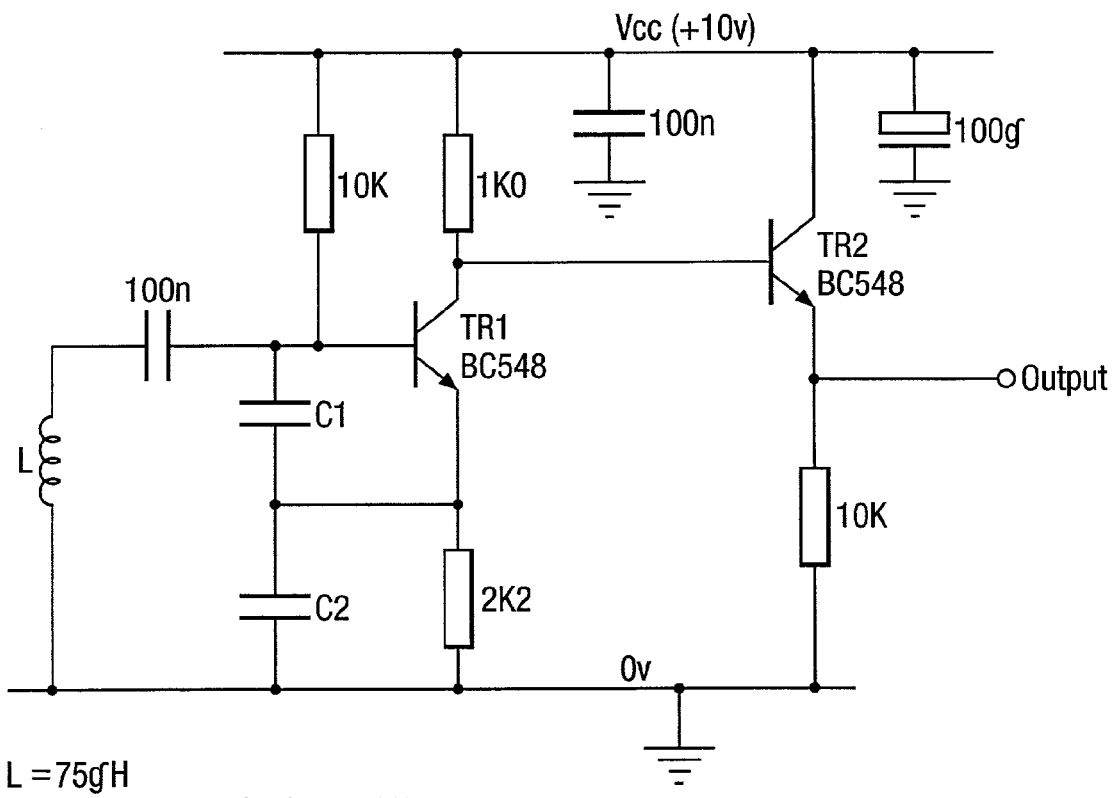
FIG. 2 is a schematic diagram of a conventional oscillator circuit.

Conventional oscillator circuits such as the Colpitts oscillator shown in FIG. 2 were not found to be stable enough to permit these very small changes in frequency to be measured reliably. A possible explanation for this poor performance is that the circuit oscillates at the frequency given by equation 7 and so the resonant frequency is affected by the internal resistance of the LC circuit. In the circuit shown in FIG. 2, the input impedance of transistor, TR1, also affects the resonant frequency of LC circuit and as this is also temperature dependant it adds to the instability of the oscillator.

Figure 3:
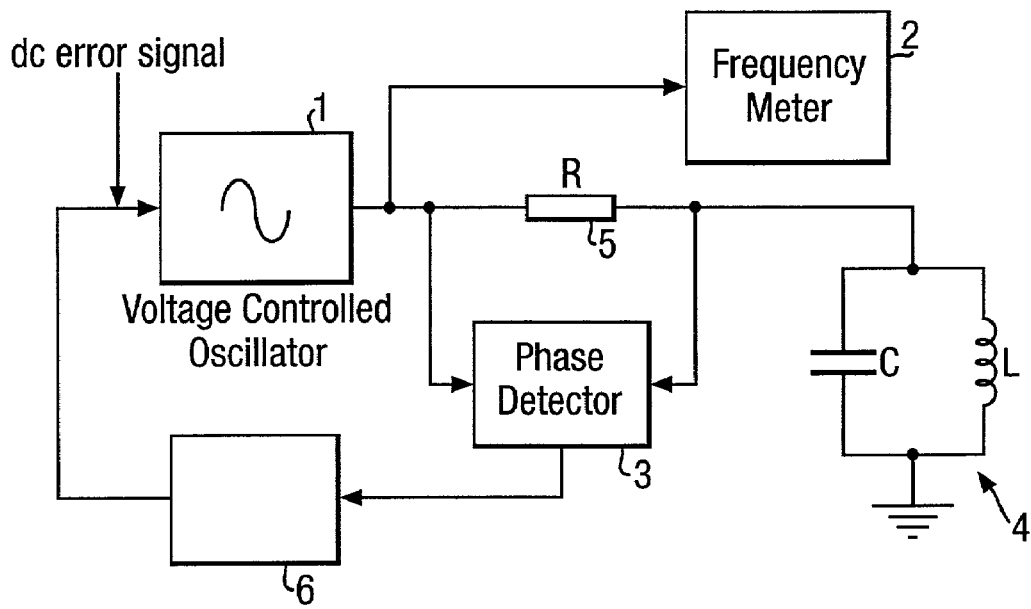
FIG. 3 is a schematic diagram of a circuit according to the present invention.

A completely new approach was required and the most stable oscillator circuit was found to be one based on a phase-locked loop (PLL), an example of which is shown in FIG. 3.

The circuit shown in FIG. 3 comprises a voltage controlled oscillator (VCO) 1 whose output is coupled to a frequency meter 2 and a phase detector 3. The output of the voltage controlled oscillator 1 is also coupled via a resistor 5 to a tuned LC circuit 4 which includes a coil L and a capacitor C, as shown. The phase detector 3, as well as being coupled to the output of the VCO 1 is also coupled to the tuned circuit 4. The output of a phase detector 3 is transferred via a loop filter 6 to the VCO 1.

In use, the VCO 1 is used to generate a drive signal which is applied to the tuned circuit 4 via the resistor 5, which causes the tuned circuit 4 to oscillate.

When the tuned circuit 4 is in resonance, the potential differences across L and C cancel each other out as they have exactly the same magnitude but are 180° (n rads) out of phase with each other. The impedance of the LC circuit at resonance is entirely resistive (approximately equal to $R_L$ in FIG. 1B) and the current flowing in the circuit is in phase with the applied voltage. The potential difference across a resistor in series with the LC circuit is in phase with the applied voltage when the circuit is in resonance. The frequency at which this occurs is given by equation (4) but with C replaced by $C+C_L$. This frequency is largely independent of $R_L$ (which is probably one of the biggest contributors to the instability of the LC circuit).

Accordingly, the phase detector 3 is coupled to the output of the VCO 1 so as to determine the phase of the driver signal, and to the tuned circuit 4 to determine the phase of the oscillation of the tuned circuit. The phase detector 3 then generates a DC signal representative of the difference in the phases of oscillation which is output to the loop filter 6. The loop filter filters the signal which is then returned to the voltage controlled oscillator 1.

The VCO 1 is controlled such that upon the application of the DC error signal, it will change its output frequency until no phase difference exists between the drive signal and the oscillation of the tuned circuit and accordingly no error signal is output from the phase detector 3.

The output frequency of the VCO is measured on the frequency meter. This circuit gives a considerably improved frequency stability and frequency changes of less than 1 Hz in the resonance frequency of 200 to 300 kHz can be measured.

Figure 5:
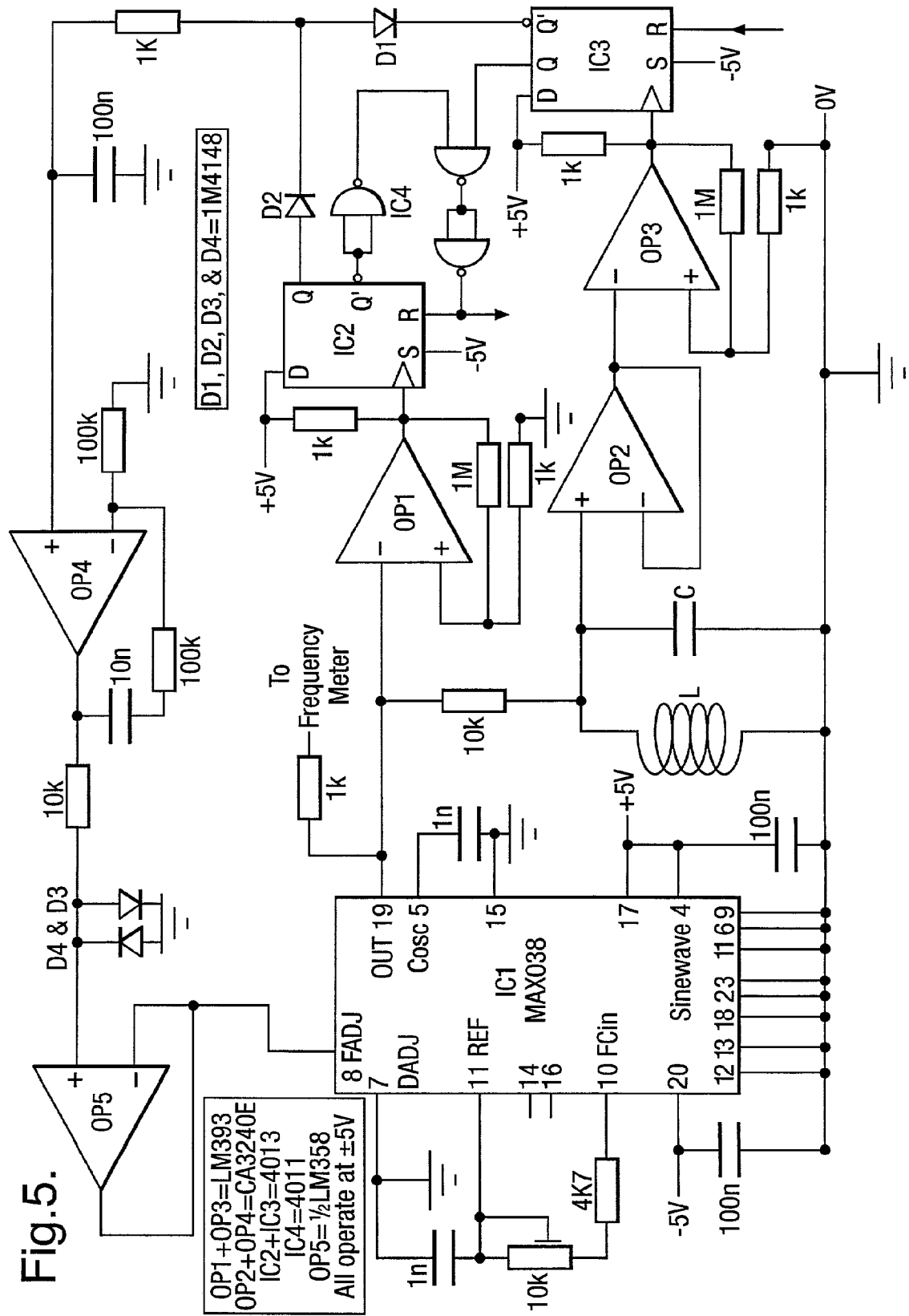
FIG. 5 is a circuit diagram of a suitable oscillator for use in the circuit of FIG. 3.

A practical circuit for a PLL VCO 1 is given in FIG. 5. IC1 is a VCO with a sine wave output which can be varied over the range from about 18 kΩ to 38 kΩ using the 10 kΩ preset. The output of the VCO is fed to the LC circuit via a 10 kΩ resistor. OP1 is a comparator which derives a square wave from the sinusoidal wave at the output of the VCO and drives IC2, a D-type flip-flop. The sinewave voltage across the LC circuit is transferred via a high-input impedance buffer amplifier (OP2) to a second comparator (OP3) and flip-flop (IC3). The flip-flops, in conjunction with the NAND gates (IC4) and the diodes D1 and D4, form an edge-sensitive lead-lag (type II) phase sensitive detector. The ±ve dc-error signal at the output of the PSD is amplified by OP4 which is a high-gain, low-pass, filter ($f_{3dB}$=16 Hz). To speed up the lock-in process after switching on, the error signal is limited to about ±0.6 V by diodes D3 and D4. The loop is closed by feeding back the dc error signal to the VCO via a buffer amplifier (OP5).

To set up the circuit, it is necessary to first calculate an approximate value for the resonance frequency for the LC circuit using equation (4). (this value must be within the output frequency range of the VCO). The preset is now adjusted until the frequency of the output of IC1 is about that of the calculated value. There is a range of adjustment of the preset where there is little variation in the output frequency. This shows that the PLL is locked onto the resonant frequency of the LC circuit.

Figure 4:
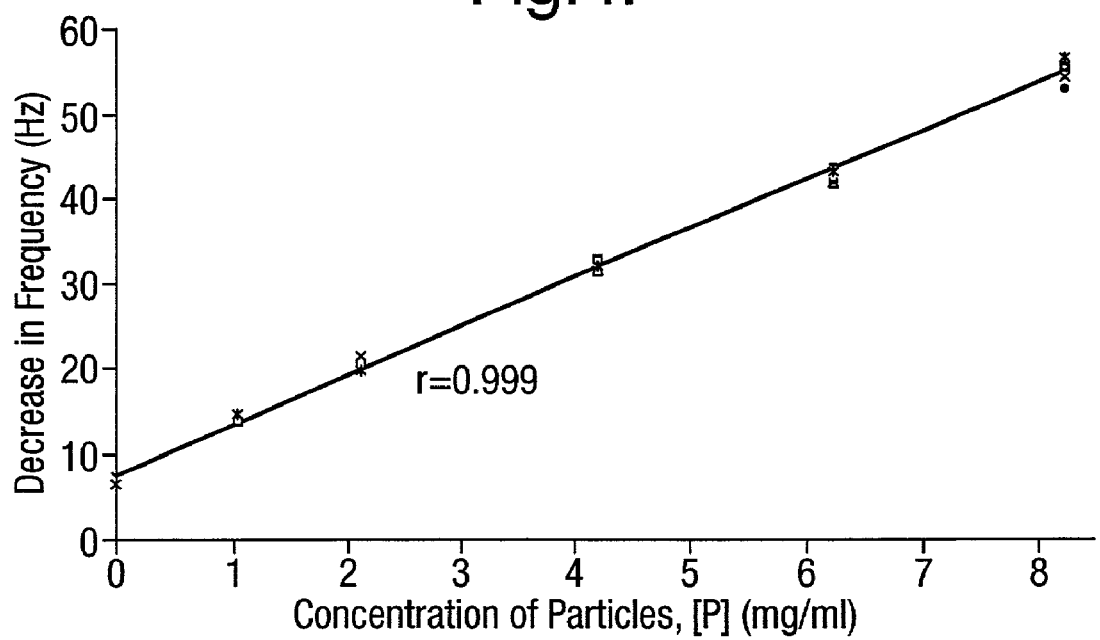
FIG. 4 is a graph showing the decrease in frequency against the concentration of particles obtained for the circuit of FIG. 3.

The performance of the PLL circuit shown in FIG. 3 was initially investigated using samples containing relatively large numbers of PMP's in suspension. The samples with known concentrations of PMP's suspended in buffer solutions (0, 1.03, 2.11, 4.19, 6.22 and 8.21 mg/ml) were used. The samples were contained in sealed, cylindrical, plastic vials, 30 mm in diameter and 47 mm high. The vials contained 20 mls of suspension. The vials were shaken vigorously to ensure a uniform mixing and then placed in the coil (50 turns of 24 SWG enamelled copper wire, inductance≈75 µH) attached to the phase-locked-loop circuit (FIG. 5) and the frequency of oscillation measured. The sample vial was now removed and the increase in frequency noted. The experiment was repeated 10 times for all the vials and the difference in the two readings was plotted against the concentration of particles in the vials, as shown in FIG. 4.

The results clearly show that the decrease in resonant frequency of the LC tuned circuit is directly related to the number of particles in suspension in the vial as predicted by equation (6). This method was found to be very reliable and it was possible to determine the concentration of particles in an unknown vial to a precision of better than 1%.

Another important finding from this work was that, although the oscillator circuit had a good short term stability of oscillation, there was still a general long term drift in the frequency caused mainly by changes in the inductance of the coil as the ambient temperature varies. Over the course of a day, changes in room temperature could cause the baseline frequency to drift by more than ±50 Hz. However this was found to have little effect on the change in frequency produced when the sample was removed from the coil. The following measurement procedure was therefore adopted to take advantage of this observation.

Insert the sample in the coil;

measure the frequency;

remove the sample rapidly from the coil; and, measure the frequency again and record the increase in frequency.

Thus, providing the change in recorded frequency is greater than the drift in baseline frequency over the measurement period, then the results obtained are independent of the baseline frequency. This procedure largely eliminates any effects of temperature on the results. Elaborate temperature control of the electronic circuitry and the coil is therefore not necessary which is an important consideration in a hand-held, battery-powered, instrument, where a temperature-controlled enclosure would consume a relatively large amount of power.

The best overall performance with the coil L in the PLL circuit of FIG. 3 and a sample vial containing the paramagnetic particles (PMPs) is obtained when the coil L:

has internal dimensions just large enough to contain the sample so that the amount of dead space is kept to a minimum;
is rigid; and
resonates between about 200 to 300 kHz.

The system can be used for carrying out measurements of a number of PMPs bonded to a substrate, as occurs for example in the immunoassay process.

In this case, using the same operating procedure as previously described, a plastic strip with an unknown number of PMP's on it was placed in the coil and the frequency of oscillation of the circuit noted. When the strip was rapidly removed from the coil and an increase in frequency was observed which can be used to determine an indication of the number of PMPs on the strip.

Calibration of the system was then performed by producing a number of substrates, which in this case were plastic strips such as those that would be used in an immunoassay process, with known numbers of PMPs thereon. These were then used to determine the frequency change obtained for a given number of particles.

The particles used were Dynal M-280 which have diameters of 2.8 μm. The concentration of particles in a sample was determined by counting the number of particles in a known volume. This was achieved using a New Neubauer haemocytometer, which has calibrated squares etched into a glass slide and a known depth. Knowing the concentration, the number of particles applied to the plastic strip was calculated. The particles were dried onto the plastic strips. Several standards with numbers of particles ranging from $3.33 \times 10^6$ to $1.68 \times 10^5$ were made and these were used to calibrate the response of the instrument.

Figure 6:
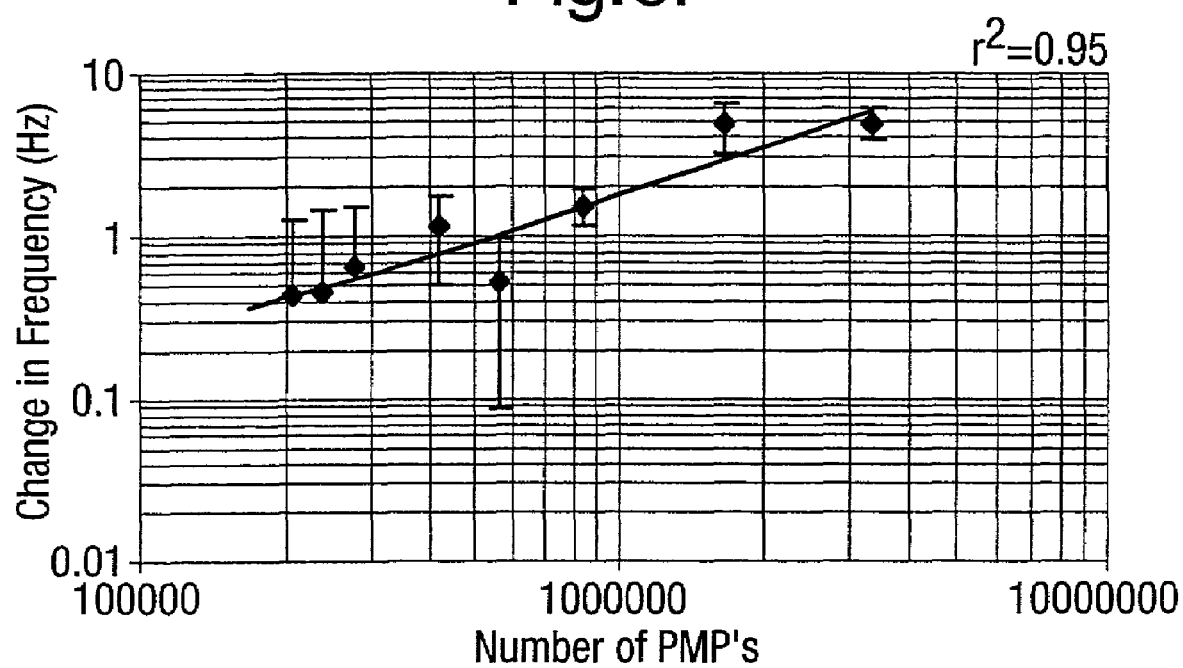
FIG. 6 is a graph showing the number of detected PMPs against the change in resonant frequency of the tuned circuit.

The response of the PLL circuit of FIG. 3 to the standard plastic strips using a basic coil configuration was determined. The method used was as described previously. A test strip with a known number of PMP's on it was inserted into the coil L and the resonant frequency of the tuned circuit 4 measured. The sample was then removed from the coil L and the resonant frequency again measured. The change in the reasonant frequency was noted. The experiment was repeated ten times using the same test strip. The experiment was repeated using the other test strips. The results are shown on a graph of the number of PMPs against the change in resonant frequency as in FIG. 6.

The results are plotted on log-log axes with a best straight line being determined using a linear regression. The points show the mean value of the readings for each sample and the error bars are the standard errors of the mean. The PLL circuit has a good linear response to the increasing number of particles on the test strips as predicted by equation (6) with a sensitivity of about $0.16 \text{ Hz}/10^5$ particles.

Some of the scatter of the results could be accounted for by the fact the samples were not deposited in exactly the same place on all the test strips and that the samples were not always placed in the coil in exactly the same place each time for each measurement.

However, in order to improve the system, several smaller coils were used in an attempt to reduce the dead space inside the coil and so increase the sensitivity of the coil L in the PLL circuit of FIG. 3. It was determined that the optimum coil is a solenoidal coil having an oval cross-sectional shape into which the sample substrates used in the immunoassay procedure just fit.

These can easily be constructed using the following method:

wind 4–6 layers of plumber's PTFE thread tape around a blank plastic strip;
wind the coil on top of the PTFE tape;
coat the coil with a thick layer of quick-setting Araldite;
allow the Araldite to set hard;
carefully pull the plastic strip to remove it from the coil; and
pull out the PTFE tape from inside the coil.

The result is a rigid coil with internal dimensions just large enough to take the test strips. A thin layer of Araldite can also be applied to the inside of the coil to protect the wire against accidental damage.

The inductance of a coil increases with the effective cross-sectional area of the coil and the number of turns in the coil. Decreasing the cross-sectional area of the coil means that the number of turns in the coil has to increase to produce a coil with the required inductance. Accordingly, the length of the coil is preferably made just slightly larger than the length of the sample. This means that the wire has to be very thin, otherwise a very thick, multilayered, coil is produced.

Figure 7:
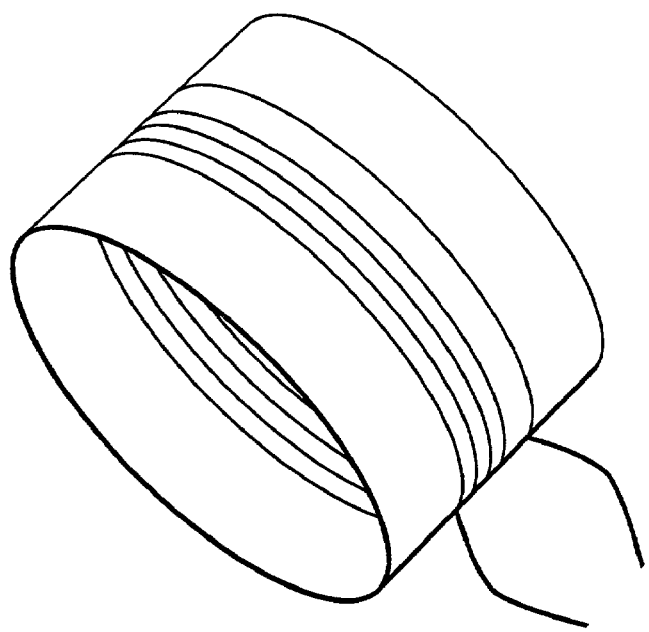
FIG. 7 is a schematic diagram of a second example of a coil for use in the tuned circuit of FIG. 3.

Accordingly, a coil L, as shown in FIG. 7, was produced made with an oval cross-section of 2.5×7 mm and 7 mm long. The coil was wound using the thinnest enamelled copper wire available (42 SWG). Four layers of wire were used and for the finished coil, L=131 μH and R=17.18Ω. The coil resonated at 217 kHz with a capacitor of C=3.3 nF in parallel with it.

Figure 8:
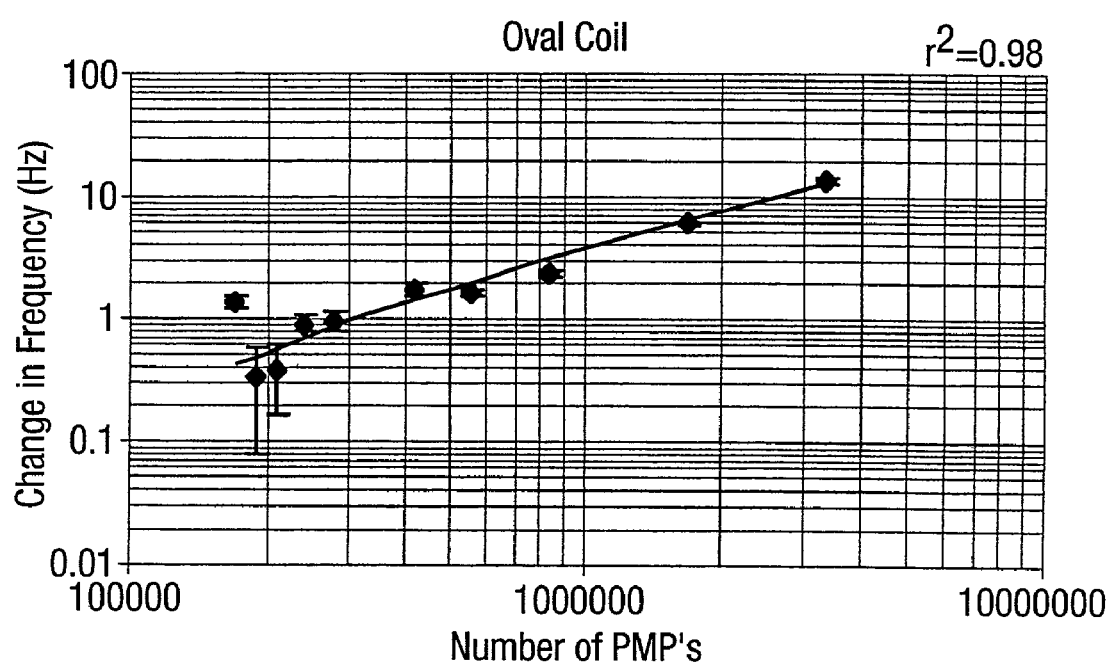
FIG. 8 is a graph showing the number of detected PMPs against the change in resonant frequency of the tuned circuit for the coil of FIG. 7.

The coil was then tested in the PLL circuit of FIG. 3, as described above. The results are shown on the graph in FIG. 8.

This coil arrangement when used with the PLL circuit also had a good linear response with an improve sensitivity compared with the previous coil design of about $0.4 \text{ Hz}/10^5$ particles on the test strip. The error bars were also smaller showing that the circuit was generally more stable. The sensitivity of this coil arrangement could be improved further by making the coil smaller so that there is even less dead space between the coil and the sample. Smaller coils would require even thinner wire than the 42 SWG used in this construction. Winding coils accurately by hand is difficult with such thin wire so some sort of machine winding would be necessary.

Recent observations also suggest that the components used in the coil construction should have a low dielectric constant to increase the Q value of the tuned circuit 4.

Figure 9:
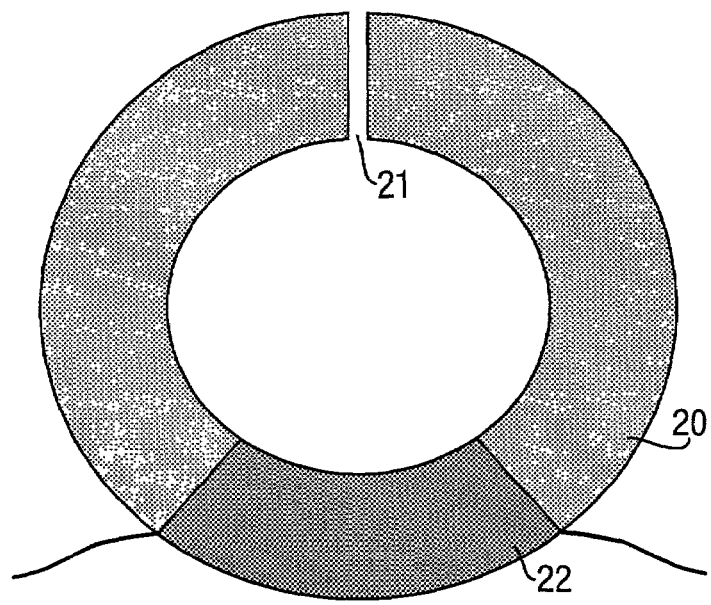
FIG. 9 is a schematic diagram of a third example of a coil for use in a tuned circuit of FIG. 3.

A further development to the coil construction is shown in FIG. 9. This comprises a ferrite ring 20 around which is wound a winding 22. Ferrites are electrical insulators which can have very high magnetic permeabilities and which can operate at very high frequencies. This means that a coil with a ferrite core requires a relatively small number of turns to have a high inductance.

Figure 10:
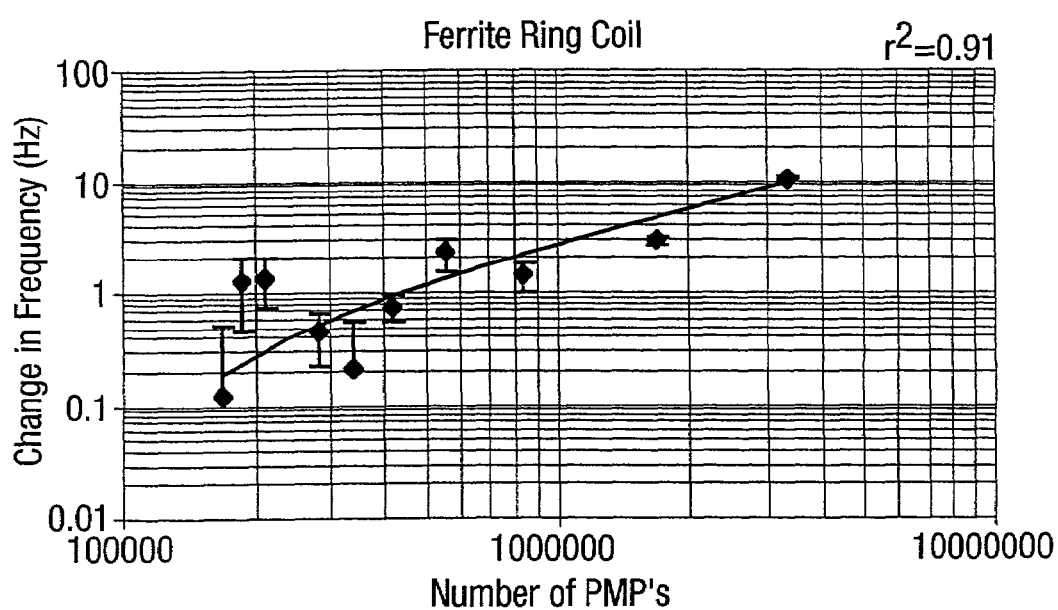
FIG. 10 is a graph showing the number of detected PMPs against the change in resonant frequency of the tuned circuit for the coil of FIG. 9.

The ferrite ring 20 includes a gap 21 which has a thickness of about 1 mm. The gap between the two ends of the ferrite is small so that little of the electromagnetic field produced by the coil is lost and it passes through a sample strip placed in the slot. As in previous examples, the presence of paramagnetic particles in the sample will increase the inductance of the coil and accordingly this configuration can be used as the coil L in the tuned circuit 4. Testing of the system was again performed, with the results plotted on the graph shown in FIG. 10. In this case the ring had the following dimensions: o.d.=23.6; i.d.=13.4; and height=7.6 mm. A coil of 120 turns this coil arrangement could be improved by using a ferrite of 40 SWG enamelled copper wire was wound on the ring and coated with a thick layer of Araldite (L=880 μH, R=4.6Ω and $f_0$=206 kHz with C=680 pF).

Again a good linear response to the number of particles was obtained when the coil was used in the PLL circuit of FIG. 3. The sensitivity of the coil was about 0.3 Hz/$10^5$ particles which is less sensitive than the oval coil construction of FIG. 7. However the performance of this coil arrangement could be improved by using a ferrite material which is better matched to this application and with a narrower slot just wide enough to take the samples (about 0.25 mm).

Figure 11A:
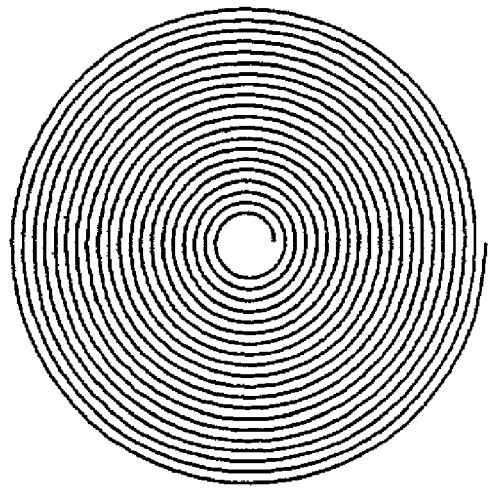
FIGS. 11A and 11B are examples of two flat coil configurations for use in the tuned circuit of FIG. 3.
Figure 11B:
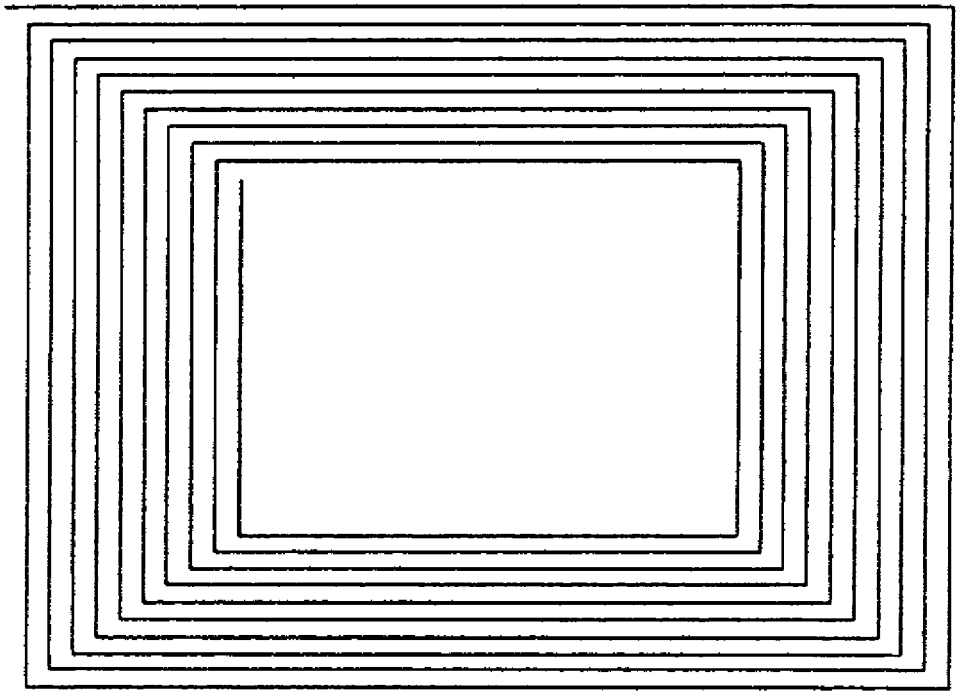

A totally flat coil based on a circular or square spiral arrangement (FIGS. 11A and 11B) can also be used. This design has several advantages over previously described arrangements. The coil can be placed in close contact with the sample, thus reducing the dead space between the sample and the coil, and reproducible coils could be mass produced using a photo-lithographic or similar technique. If two coils are connected in series and placed facing each other with the sample between them, then the presence of paramagnetic particles in the sample would increase the inductance of the pair.

As stated earlier, the coils were generally operated at frequencies between about 200 to 300 kHz. This was found by experiment to be the best operating frequency range when the circuit was used with vials containing large numbers of PMP's suspended in aqueous buffer solutions. However, the presence of the water makes the circuits less stable when operated at higher frequencies.

Figure 12:
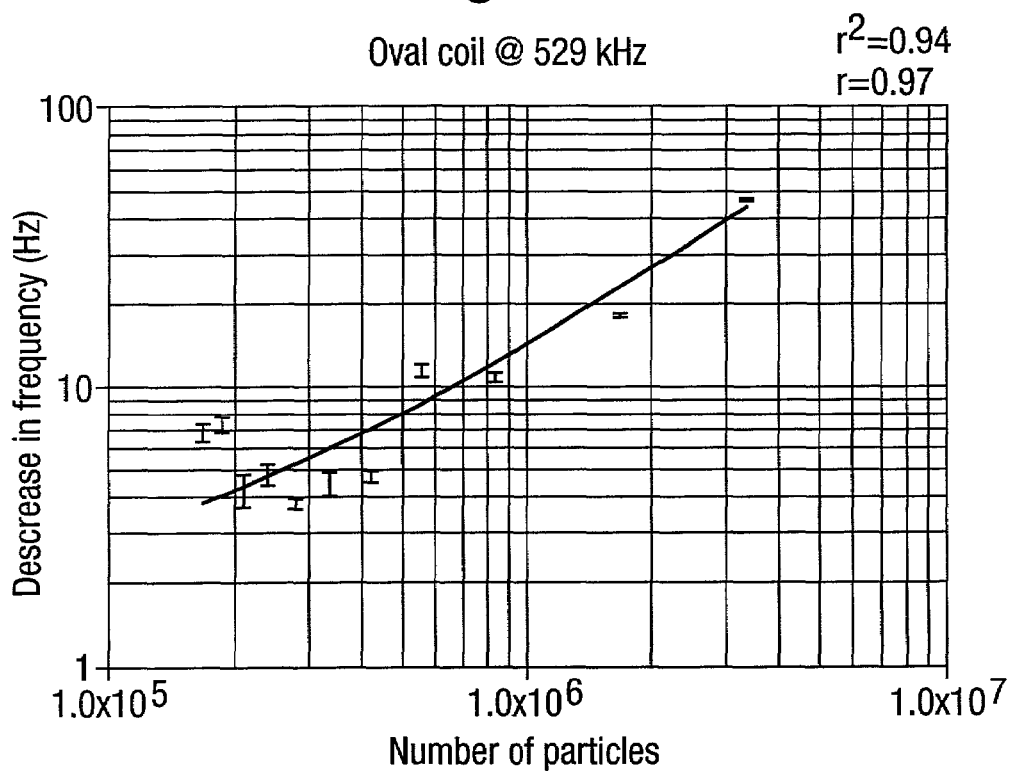
FIG. 12 is a graph showing the number of detected PMPs against the change in resonant frequency of the tuned circuit for the coil of FIG. 7; and, FIG. 13 is a schematic diagram of an immunoassay reaction according to the present invention.

It is found to work better at much higher frequencies. FIG. 12 shows the response of the circuit with the oval coil operating at 529 kHz.

In this case the sensitivity is increased to 1.2 Hz/$10^5$ particles compared with 0.4 Hz/$10^5$ particles when the coil was operated at 217 kHz. The general technique would demonstrate improved sensitivity at even higher frequencies. However the VCO circuit of FIG. 5 is unable to operate reliably at a frequencies much higher than 519 kHz because of limitations in the performance of some of the components used. To get it to operate at higher frequencies, it will be necessary to modified the circuit by using components which can operate at these frequencies.

Figure 13:
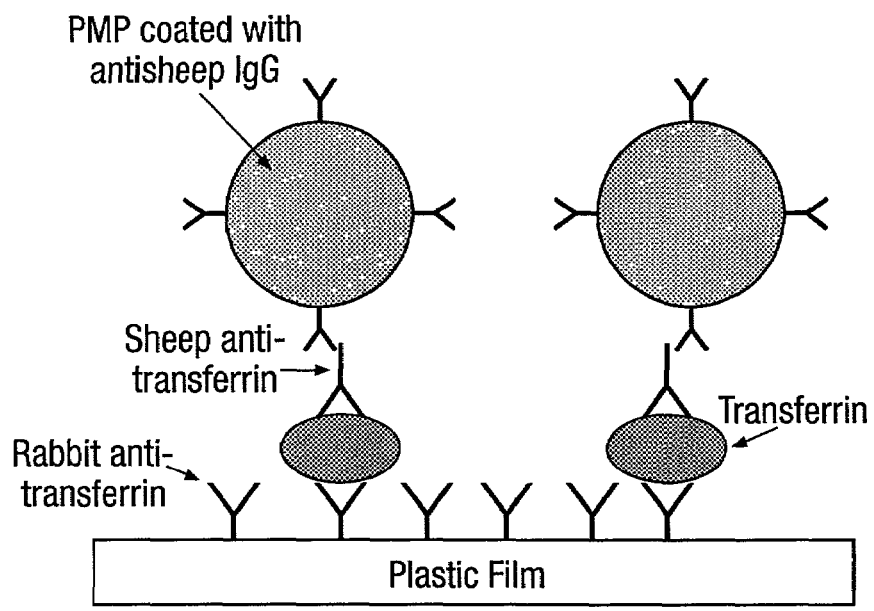

In order to demonstrate the practical use of the paramagnetic particle detector, a model assay system, using PMP's as a label, was developed. This was based on a double antibody, sandwich assay for transferrin. The model assay was developed so the immune reaction occurred on the surface of a plastic film and the test area could be easily introduced onto the detector. The label used to detect the immobilized immune complex was a PMP coated with a suitable antibody. This is shown schematically in FIG. 13.

The concentration of the different antibody layers was optimised to give maximum response over the working transferrin concentration range. A dose response curve was generated for the model assay, the numbers of particles being quantified both by manual counting using a microscope and using the detector.

Early results show that the upper regions of the transferrin dose response curve (about 1.3×$10^5$ particles) lie within the lower calibration range of the magnetic detector and there is good agreement between the number of bound PMP's on the strip determined by manual counting and the number determined using the magnetic detector.

We claim:

1. A method of performing a binding assay by determining the number of magnetic particles bound to a substrate, the method comprising:
   a. immobilizing a layer of molecules to a substrate;
   b. providing a number of magnetic particles as labels;
   c. performing a reaction using the molecular layer so as to bind at least some of the magnetic particles to the substrate; and,
   d. determining the number of magnetic particles bound to the substrate by determining the difference in the resonant frequency of a tuned circuit when the substrate is exposed to a magnetic field generated by a coil and when the substrate is not exposed to the magnetic field generated by the coil wherein the tuned circuit is connected to a phase locked loop comprising a driver which generates a driving signal for driving the tuned circuit, and a phase comparator for determining the phase difference between the driving signal and an output signal obtained from the tuned circuit, the phase comparator being adapted to generate a difference signal representative of said phase difference, said difference signal being fed back to said driver so as to cause said driver to drive the tuned circuit to reduce the determined phase difference.

2. A method according to claim 1, wherein the magnetic particles are bound to a respective number of second molecules and wherein the reaction binds second molecules with the molecular layer so as to bind the magnetic particles to the substrate.

3. A method according to claim 2, wherein the binding assay is an immunoassay, the molecular layer being an antibody/antigen layer and the second molecules being antigens or antibodies.

4. A method according to claim 1, wherein the substrate comprises a plastic strip.

5. A method according to claim 1, wherein the coil is one of a solenoid, a ring coil and a flat coil.

* * * * *